(12) United States Patent
Shiu et al.

(10) Patent No.: US 9,060,424 B2
(45) Date of Patent: Jun. 16, 2015

(54) BALL GRID ARRAY FORMED ON PRINTED CIRCUIT BOARD

(75) Inventors: Jian-Feng Shiu, Hsinchu County (TW); Eer-wen Tyan, Hsinchu County (TW); Ting-Kuang Wang, Hsinchu County (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 144 days.

(21) Appl. No.: 13/590,590

(22) Filed: Aug. 21, 2012

(65) Prior Publication Data

US 2013/0048364 A1 Feb. 28, 2013

(30) Foreign Application Priority Data

Aug. 23, 2011 (TW) .............................. 100130118 A

(51) Int. Cl.
*H05K 1/11* (2006.01)
*H05K 3/10* (2006.01)
*H05K 1/02* (2006.01)

(52) U.S. Cl.
CPC ......... *H05K 1/0219* (2013.01); *Y10T 29/49155* (2015.01); *H05K 1/0243* (2013.01); *H05K 1/112* (2013.01); *H05K 2201/10734* (2013.01)

(58) Field of Classification Search
CPC ........... H05K 1/00; H05K 1/18; H05K 1/111; H05K 1/03; H05K 1/14
USPC ................... 361/720, 736, 728, 748; 174/250
See application file for complete search history.

(56) References Cited

U.S. PATENT DOCUMENTS 5,424,492 A * 6/1995 Petty et al. .................... 174/250
5,773,856 A * 6/1998 Bearden et al. ............... 257/207

(Continued)

FOREIGN PATENT DOCUMENTS

TW 200531611 A 9/2005
TW 200842635 A 11/2008

OTHER PUBLICATIONS

Author: Sharp, Sr. Marketing Manager, Xilinx, Inc. Author: Panch Chadrasekaran, Connectivity Marketing Manager, Xilinx, Inc. Managing Signal Integrity being heard above the noise. Jul. 2005 XILINX Issue 1 pp. 5-7.*

(Continued)

*Primary Examiner* — Timothy Thompson
*Assistant Examiner* — Michael F McAllister
(74) *Attorney, Agent, or Firm* — WPAT, PC; Justin King

(57) ABSTRACT

A ball grid array formed on a printed circuit board is provided. The ball grid array includes a first bailout module and a second bailout module. The first bailout module includes a plurality of first solder balls arranged as an array. Two of the first solder balls are grounded, and remaining of the first solder balls are disposed within a shielding area defined by the two grounded first balls. Two among the second solder balls are grounded, and remaining of the second solder balls are disposed within a shielding area of the two grounded second balls. The first and second bailout modules deploy substantially a same bailout arrangement, which is associated with relative positions of the two grounded solder balls and the remaining solder balls that are not grounded in each bailout module.

12 Claims, 5 Drawing Sheets

(56) References Cited

U.S. PATENT DOCUMENTS

| | | | |
|---|---|---|---|
| 6,194,668 B1* | 2/2001 | Horiuchi et al. | 174/261 |
| 6,198,635 B1* | 3/2001 | Shenoy et al. | 361/760 |
| 6,373,139 B1* | 4/2002 | Clark | 257/774 |
| 7,095,107 B2* | 8/2006 | Ramakrishnan et al. | 257/691 |
| 7,405,946 B2* | 7/2008 | Hall et al. | 361/783 |
| 7,501,341 B1* | 3/2009 | Von Herzen | 438/666 |
| 7,569,428 B2* | 8/2009 | Isa et al. | 438/129 |
| 7,816,610 B2* | 10/2010 | Li | 174/255 |
| 2008/0257583 A1* | 10/2008 | Li | 174/250 |

OTHER PUBLICATIONS

Author: Steven Sharp, Sr. Marketing Manager, Xilinx, Inc. Author: Panch Chadrasekaran, Connectivity Marketing Manager, Xilinx, Inc. Managing Signal Integrity being heard above the noise. Jul. 2005 XILINX Issue 1 pp. 5-7.*

Application note. AN-114-5.1 Altera Corporation Dec. 2007 Vo. 5.1 Designing With High-Density BGA Packages for Altera Devices.*

Taiwan Intellectual Property Office, "Office Action", Jul. 26, 2013.

* cited by examiner

BALL GRID ARRAY FORMED ON PRINTED CIRCUIT BOARD

This application claims the benefit of Taiwan application Serial No. 100130118, filed Aug. 23, 2011, the subject matter of which is incorporated herein by reference.

BACKGROUND OF THE INVENTION

1. Field of the Invention

The invention relates in general to a ball grid array formed on a printed circuit board, and more particularly, to a ball grid array having good ground shielding.

2. Description of the Related Art

To electrically connect a ball grid array (BGA) packaged chip to a printed circuit board, the printed circuit board must be provided with a ball grid array corresponding to the packaged chip. The ball grid array on the printed circuit board is formed by a plurality of solder balls, few of which are connected to ground so as to ground shield the remaining solder balls. However, an arrangement of a ball grid array on a printed circuit board is not necessarily regularly patterned. That is, a shape of the ball grid array as well as the number and positions of the grounded solder balls may vary along with different chips.

As described above, since a conventional arrangement of solder balls is not fixed to a regulated pattern, and solder balls may be scattered with a low density, thus, the usable area of the printed circuit board is often under-utilized. Further, a custom design of a ball grid array is unlikely to be repeatedly used, and human resources are required for verifying performance of a ball grid array.

SUMMARY OF THE INVENTION

To solve the foregoing issues, the invention is directed to a ball grid array having a more regulated bailout arrangement and occupying a smaller area on a printed circuit board.

According to an embodiment of the present invention, a ball grid array formed on a printed circuit board is provided. The ball grid array includes a first bailout module and a second bailout module. The first bailout module includes a plurality of first solder balls arranged as an array. Two among the first solder balls are grounded, and remaining of the first solder balls are disposed within a shielding area defined by the two grounded first solder balls. The second bailout module includes a plurality of second solder balls. Two among the second solder balls are grounded, and remaining of the second solder balls are disposed within a shielding area defined by the two grounded second solder balls. The first bailout module and the second bailout module deploy substantially a same bailout arrangement, which is associated with relative positions of the two grounded solder balls and the remaining solder balls that are not grounded in each bailout module.

According to another embodiment of the present invention, a ball grid array formed on a printed circuit board is provided. The ball grid array includes a plurality of bailout modules. At least one of the bailout modules includes a plurality of solder balls arranged as an array having more than five rows. A first row of the bailout module faces a signal input wire on the printed circuit board inputting into the bailout module, only one solder ball of the first five rows of the bailout module is grounded, and remaining of the solder balls of the first five rows are within a shielding area defined by the grounded solder ball. The plurality of bailout modules deploy substantially a same bailout arrangement, which is associated with relative positions of the grounded solder ball and the remaining solder balls that are not grounded in each bailout module.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
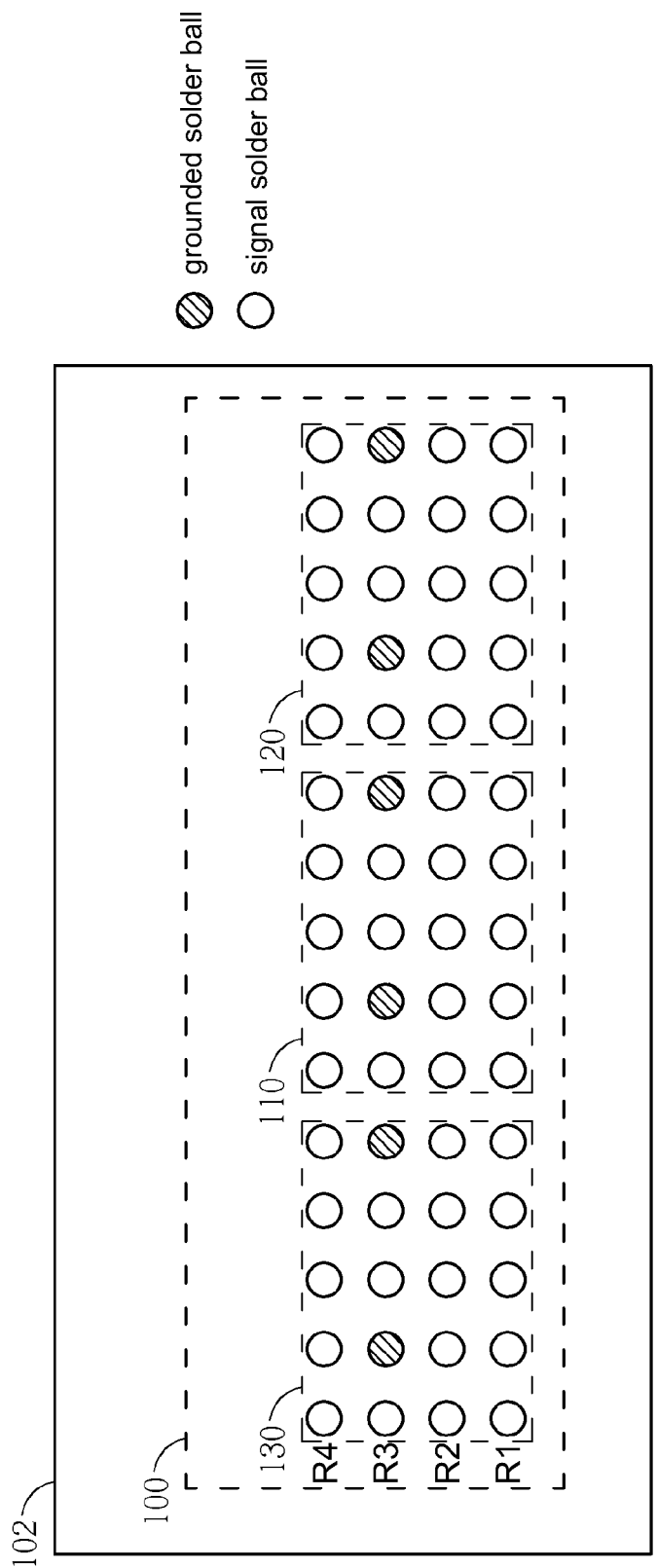
FIG. 1 is a schematic diagram of a ball grid array formed on a printed circuit board according to an embodiment of the present invention.

FIG. 1 shows a schematic diagram of a ball grid array 100 formed on a printed circuit board 102 according to an embodiment of the present invention. As shown in FIG. 1, the ball grid array 100 includes a first bailout module 110, a second bailout module 120 and a third bailout module 130. The first, second, and third bailout modules 110, 120, and 130 deploy substantially a same bailout arrangement. Each of the bailout modules 110, 120, and 130 includes twenty solder balls in a 4 by 5 array. That is, in each of the bailout modules 110, 120, and 130, each row includes five solder balls and each column includes four solder balls. Further, in each of the bailout modules 110, 120, and 130, only two solder balls disposed at the third row R3_ of the solder balls are grounded. The first row R1 of each of the bailout modules 110, 120, and 130 faces a signal input wire on the printed circuit board inputted to the bailout module. As seen from FIG. 1, the ball grid array according to the embodiment of the present invention is formed by a plurality of bailout modules having substantially a same bailout arrangement. Details of the bailout module offering complete shielding effects over the ball grid array through two grounded solder balls shall be described with reference to FIG. 2.

Figure 2:
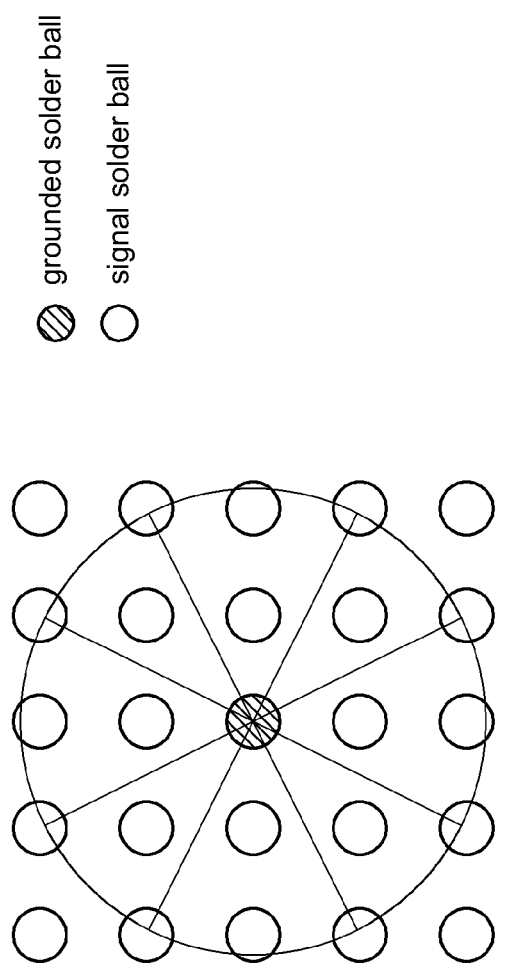
FIG. 2 is a schematic diagram of a shielding area provided by a grounded solder ball according to an embodiment of the present invention.

FIG. 2 shows a schematic diagram of a shielding area defined by a grounded solder ball according to an embodiment of the present invention. As shown in FIG. 2, there are 8 equal straight lines extended from the grounded solder ball, and each straight line connects to one signal solder ball.

Each straight line is approximately twice of a distance between two solder balls, and the FIG. 2 shows a circle with this straight line as its radius, such that, the circle is the area which can be shielded with the grounded solder ball. That is, an area shielded by one grounded solder ball is a circle having a radius of approximately twice of a distance between two solder balls.

As observed from FIG. 2, the shielding circumferential area is consisted of 8 sections defined by these 8 straight lines extended from the grounded solder ball. There are 4 sections each substantially covers two ungrounded solder balls in four directions, namely, upper, lower, left, and right directions;

each of the 4 sections has an included angle of 30 degrees or 60 degrees with virtual axes in the upper, lower, left, and right directions. The other 4 sections of the shielding circumferential area covers only one ungrounded solder ball at four directions at an inclined angle of 45 degrees from the virtual axes in the upper right, lower right, left upper, and left right directions. With reference to the shielding area defined by the grounded solder ball in FIG. 2 and the bailout module in FIG. 1, as all the solder balls in the ball grid array 100 in FIG. 1 are all within the shielding area defined by the grounded solder balls, one single bailout module needs to include at least two grounded solder balls in order to cover all the solder balls in the ball grid array 100 within the shielding areas of the grounded solder balls.

Figure 3B:
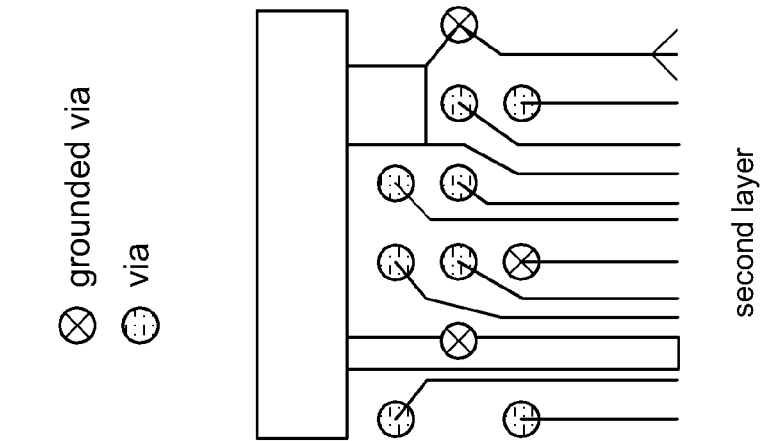
FIG. 3A and FIG. 3B are a schematic diagram of a top view for a ball grid array applied to a two-layer printed circuit board according to an embodiment of the present invention.
Figure 3A:
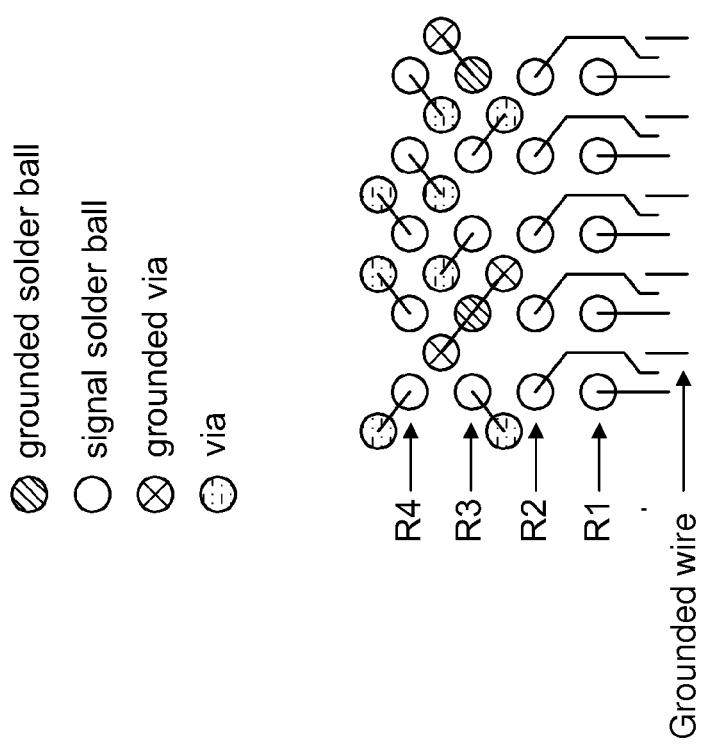

In an embodiment, the printed circuit board 102 may be a two-layer board, and the ball grid array 100 is applied to a double-data-rate (DDR) dynamic random access memory (DRAM). FIG. 3A and FIG. 3B show schematic diagram of the top view for the ball grid array 100 applied to a two-layer printed circuit board 102 according to an embodiment of the present invention. It should be noted that, only the first bailout module 110 is depicted in FIG. 3A and FIG. 3B for better explaining the embodiment. As shown in FIG. 3A and FIG. 3B, under conditions of limited spaces between the solder balls, a ground wire is needed next to each signal wire, and a ground signal via is also needed near each signal via, in order to provide complete shielding. The solder balls of the R1 and R2 two rows are connected to other circuits/chips on the printed circuit board 102 through first-layer signal wires, and the solder balls of the R3 and R4 two rows are connected to other circuits/chips on the printed circuit board 102 through second-layer signal wires and vias. It can be observed that the first-layer signal wires are easily shielded because of the ground wires are also located at the first layer, while the second-layer signal wires can only rely on the ground wires connected to the ground balls through the grounded vias to provide shielding. That is to say, apart from one single bailout module necessarily including two grounded solder balls, the two grounded solder balls also need to be located at R3 the third row of the bailout module. Thus, the ball grid array 100 can provide a total shielding with a minimum number of grounded solder balls and a smallest area on the printed circuit board.

Figure 4:
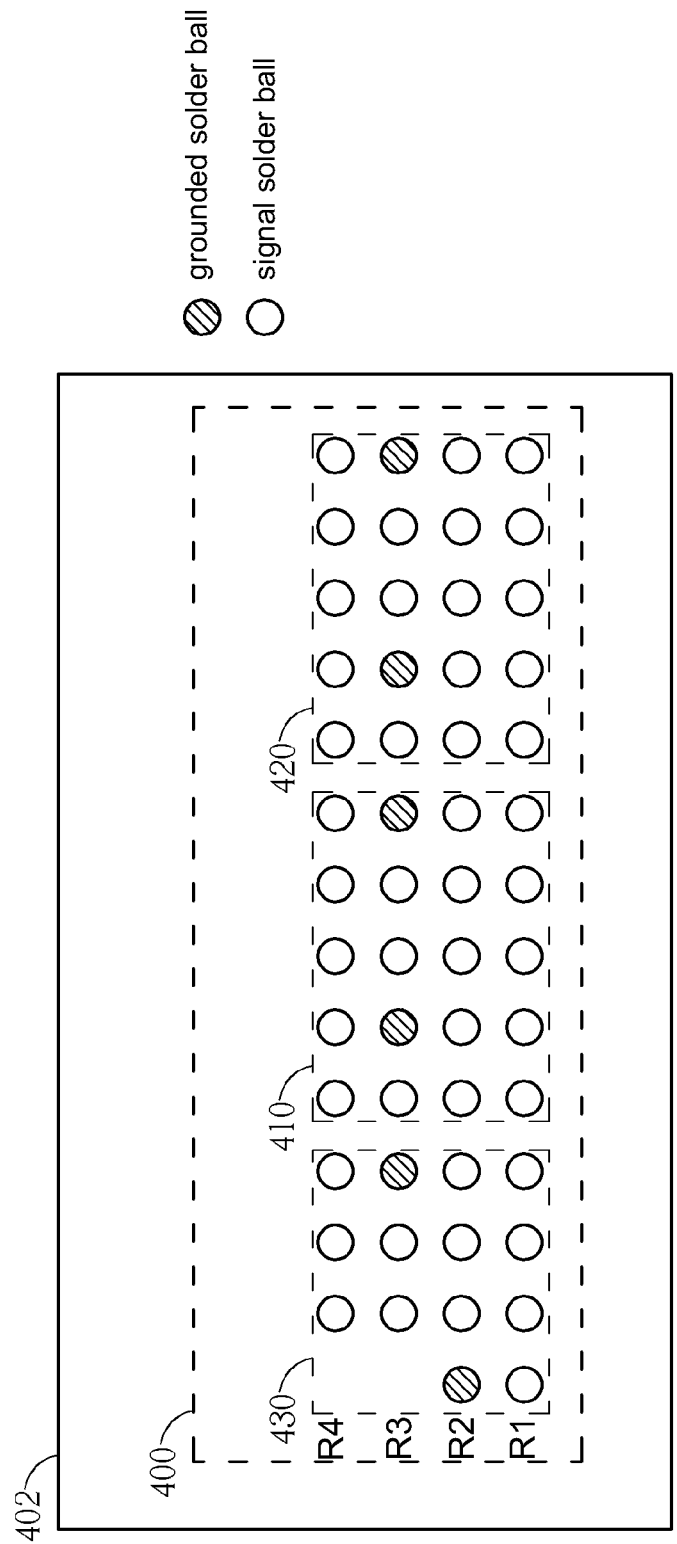
FIG. 4 is a schematic diagram of a ball grid array formed on a printed circuit board according to another embodiment of the present invention.

Further, when the ball grid array 100 is applied to DDR2/DDR3, only 48 signal solder balls are required. In the occurrence of a bailout conflict in the design with peripheral elements, a slight modification may be made to the second bailout module 120 and the third bailout module 130 in FIG. 3A and FIG. 3B to prevent the bailout conflict. For example, FIG. 4 shows a schematic diagram of a ball grid array 400 formed on a printed circuit board 402 according to another embodiment of the present invention. As shown in FIG. 4, the ball grid array 400 includes a first bailout module 410, a second bailout module 420, and a third bailout module 430. The ball grid array 400 is similar to the ball grid array 100 in FIG. 1, with a main difference being that the third bailout module 430 includes only 14 solder balls (may be regarded as 6 signal solder balls at the left of the third bailout module 130 in FIG. 1 having been removed), and one grounded solder ball is disposed at the second row R2. It is apparent that, the shielding provided by the ball grid array 400 remains unaffected even though the grounded solder ball in the third bailout module 430 is disposed at the second row.

Figure 5:
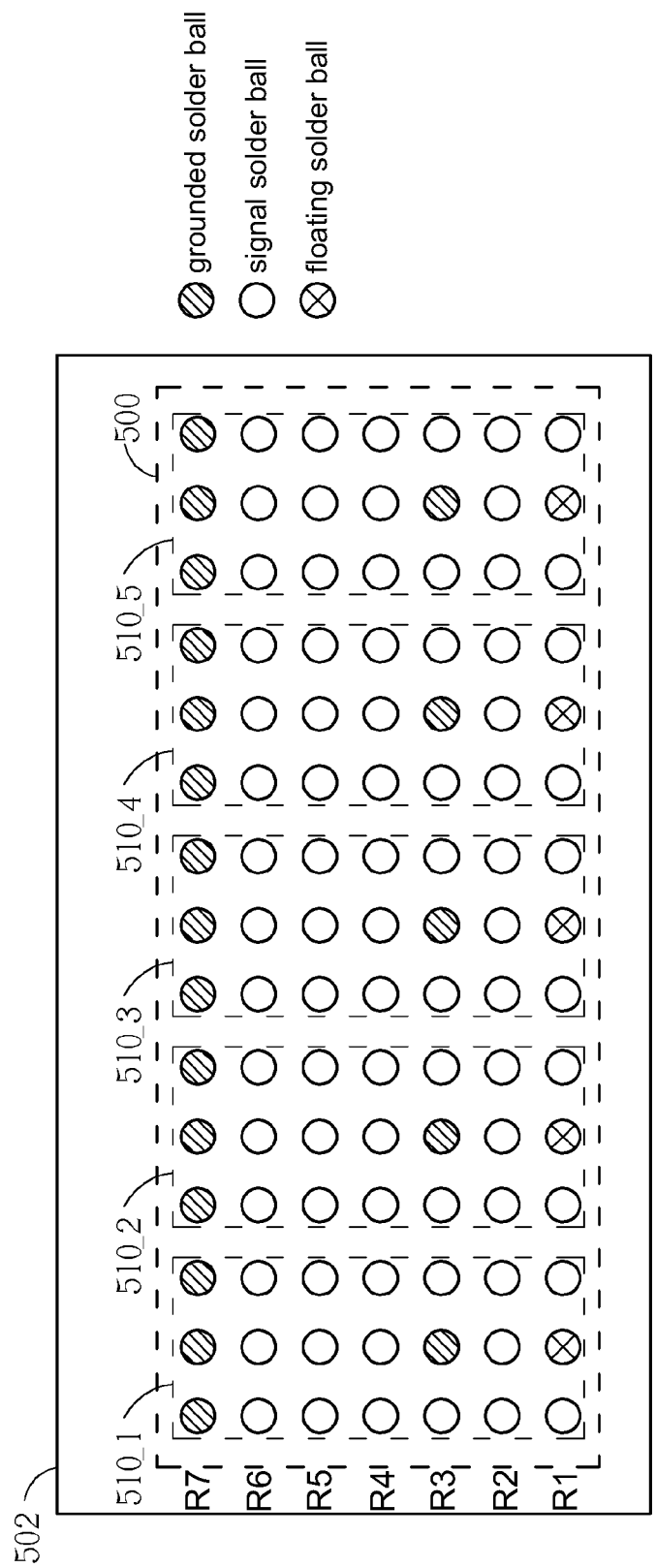
FIG. 5 is a schematic diagram of a ball grid array formed on a printed circuit board according to yet another embodiment of the present invention.

FIG. 5 shows a schematic diagram of a ball grid array 500 formed on a printed circuit board 502 according to yet another embodiment of the present invention. As shown in FIG. 5, the ball grid array 500 includes five bailout modules 510_1 to 510_5, which employ a same bailout arrangement. Each of the bailout modules 510_1 to 510_5 includes a plurality of solder balls arranged in a 7 by 3 array. In each of the bailout modules 510_1 to 510_5, each row includes three solder balls, and each column includes seven solder balls. Further, in each of the bailout modules 510_1 to 510_5, the first row R1 faces the signal input wire on the printed circuit board 502 inputting into the bailout modules 510_1 to 510_5, and the first five rows R1, R2, R3, R4, and R5 of each bailout modules include only one grounded solder ball. With reference to the shielding area of the grounded solder ball in FIG. 2, all the solder balls in the ball grid array 500 in FIG. 5 are within the shielding areas of the grounded solder balls.

It should be noted that, the bailout arrangement of the ball grid array 500 in FIG. 5 is merely an example for illustrating the present invention rather than a limitation of the present invention. For example, in an alternative embodiment, the bailout modules 510_1 to 510_5 do not necessarily employ the same bailout arrangement. That is to say, the number of the solder balls in the bailout modules 510_1 to 510_5 may be changed, and floating solder balls in FIG. 5 may serve for other purposes, as such modifications are all encompassed within the scope of the present invention.

Further, in another embodiment, the printed circuit board 502 may be a four-layer board, and the ball grid array 500 is applied to a DDR DRAM.

In conclusion, the ball grid array formed on a printed circuit board provided by the present invention has a more regulated bailout arrangement and thus achieves satisfactory shielding through a minimum number of grounded solder balls and a smallest area on the printed circuit board. Therefore, compared to a conventional ball grid array having irregular patterns, the present invention can be repeated utilized for reducing human resources needed for verifying the performance of the ball grid array.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A ball grid array, formed on a printed circuit board, comprising:
   a first bailout module, comprising a plurality of first solder balls arranged as an array, wherein two among the first solder balls are grounded and remaining of the first solder balls are disposed within a shielding area defined by the two grounded first solder balls, wherein a first row of the first bailout module faces a first direction, a first column of the first ball module faces a second direction, the first direction is perpendicular to the second direction, and the two grounded first solder balls are disposed at a third row of the first bailout module; and
   a second bailout module, disposed adjacent to the first bailout module and comprising a plurality of second solder balls, wherein two among the second solder balls are grounded and remaining of the second solder balls are disposed within a shielding area defined by the two grounded second solder balls;
   wherein the first ballout module and the second ballout module deploy substantially a same ballout arrangement associated with relative positions of the two grounded solder balls and the remaining solder balls that are not grounded in each ballout module;

wherein the ball grid array renders at most two grounded soldier balls in every five columns of solder balls.

2. The ball grid array according to claim 1, wherein the ballout arrangement comprises two grounded first solder balls for the first ballout module.

3. The ball grid array according to claim 1, wherein a number of the second solder balls of the second ballout module equals a number of the first solder balls of the first ballout module, and positions of the two grounded second solder balls in the second ballout module are identical to positions of the two grounded first solder balls in the first ballout module.

4. The ball grid array according to claim 1, further comprising:
   a third ballout module, arranged next to the first ballout module, comprising a plurality of third solder balls; wherein two of the third solder balls are grounded, and remaining of the third solder balls are disposed within a shielding area defined by the two grounded third solder balls;
   wherein, the third ballout module deploys the substantially same ballout arrangement as that of the first ballout module and the second ballout module.

5. The ball grid array according to claim 4, wherein maximum numbers of the first solder balls, the second solder balls and the third solder balls are twenty respectively.

6. The ball grid array according to claim 4, wherein quantity of the third solder balls equals quantity of the first and the second solder balls; and positions of the two grounded third solder balls in the third ballout module are identical to the positions of the two grounded first solder balls in the first ballout module, as well as the positions of the two grounded second solder balls in the second ballout module.

7. The ball grid array according to claim 1, being applied to a double-data-rate (DDR) dynamic random access memory (DRAM).

8. A wiring method for a multi-layer printed circuit board, comprising:
   providing one at least two-layer printed circuit, a plurality of signal wires and a plurality grounding wires;
   disposing a first ballout module and a second ballout module on one layer of the two-layer printed circuit board;
   wherein the first ballout module comprises a plurality of first solder balls arranged as an array, two of the first solder balls are grounded and remaining of the first solder balls are disposed within a shielding area defined by the two grounded first solder balls, wherein a first row of the first ballout module faces a first direction, a first column of the first ball module faces a second direction, the first direction is perpendicular to the second direction, and the two grounded first solder balls are disposed at a third row of the first ballout module;
   wherein the second ballout module is adjacent to the first ballout module and comprising a plurality of second solder balls, wherein two of the second solder balls are grounded and remaining of the second solder balls are within a shielding area defined by the two grounded second solder balls;
   wherein the first ballout module and the second ballout module deploy substantially a same ballout arrangement associated with relative positions of the rounded solder balls and the remaining ungrounded solder balls; and
   wherein the ballout arrangement renders at most two rounded soldier balls in every five columns of solder balls; and
   providing a plurality of vias on one other layer of the two-layer printed circuit board, wherein the signal wires pass through a part of the vias to connect to the solder balls of the first ballout module, the grounding wires pass through a part of the vias to connect to the two grounded solder balls of the first and second ballout modules, in a way that one side of each of the signal wires is adjacent to one of the grounding wire.

9. The ball grid array according to claim 1, wherein said array comprises at least four rows and at least five columns.

10. The wiring method according to claim 8, wherein said array comprises at least four rows and at least five columns.

11. The ball grid array according to claim 1, wherein a last column of the first ballout module is adjacent to a first column of the second ballout module.

12. The wiring method according to claim 8, wherein a last column of the first ballout module is adjacent to a first column of the second ballout module.

* * * * *